(12) United States Patent
Kishimoto et al.

(10) Patent No.: US 6,603,210 B2
(45) Date of Patent: Aug. 5, 2003

(54) SEMICONDUCTOR MODULE AND PRODUCING METHOD THEREFOR

(75) Inventors: Kiyoharu Kishimoto, Yokohama (JP); Ryuzo Fukao, Moriya-machi (JP); Koji Yamaguchi, Moriya-machi (JP); Hiroyuki Tsukamoto, Toride (JP); Yuji Yamashita, Moriya-machi (JP); Yuji Kikuchi, Ishige-machi (JP); Tomonori Kanai, Moriya-machi (JP)

(73) Assignee: Hitachi Maxell, Ltd., Osaka (JP)

( * ) Notice: Subject to any disclaimer, the term of this patent is extended or adjusted under 35 U.S.C. 154(b) by 0 days.

(21) Appl. No.: 09/902,746

(22) Filed: Jul. 12, 2001

(65) Prior Publication Data
US 2002/0020925 A1 Feb. 21, 2002

(30) Foreign Application Priority Data

Jul. 12, 2000 (JP) .................................... 2000-212068
Nov. 10, 2000 (JP) .................................... 2000-343688
Mar. 15, 2001 (JP) .................................... 2001-074590

(51) Int. Cl.⁷ .............................................. H01L 23/48
(52) U.S. Cl. .................... 257/781; 257/723; 257/724; 257/780; 257/779; 257/748; 257/787
(58) Field of Search ................. 257/723, 724, 257/787, 779, 780, 781, 748

(56) References Cited

U.S. PATENT DOCUMENTS 5,844,304 A * 12/1998 Kata et al. .................. 257/620
6,274,391 B1 * 8/2001 Wachtler et al. .............. 438/6
6,396,148 B1 * 5/2002 Eichelberger et al. ...... 257/750

* cited by examiner

Primary Examiner—Kamand Cuneo
Assistant Examiner—Luan Thai
(74) Attorney, Agent, or Firm—Birch, Stewart, Kolasch & Birch, LLP

(57) ABSTRACT

For producing a semiconductor module, an electrically insulating layer and an electrically conductive layer are formed on a Nickel-base metal film over a metallic surface, the electrically conductive layer is connected electrically to an electric element through an electrically conductive joint arranged between the electric element and the electrically conductive layer, at least a part of the electric element and at least a part of the electrically conductive joint are covered with a molding resin, and subsequently, the Nickel-base metal film is removed from the metallic surface so that a combination of the Nickel-base metal film, the electrically insulating layer, the electrically conductive layer, the electrically conductive joint and the molding resin is separated from the metallic surface.

7 Claims, 15 Drawing Sheets

1K

| NICKEL PLATING THICKNESS (μm) | CRACK OR THE LIKE OF NICKEL PLATING | STAINLESS-STEEL PLATE CURVE |
|---|---|---|
| 3 | × | ○ |
| 5 | △ | ○ |
| 8 | ○ | ○ |
| 17 | ○ | ○ |
| 20 | ○ | ○ |
| 25 | ○ | × |

SEMICONDUCTOR MODULE AND PRODUCING METHOD THEREFOR

BACKGROUND OF THE INVENTION AND RELATED ART STATEMENT

The present invention relates to a semiconductor module and producing method therefor.

In a prior art semiconductor module, an electrically conductive layer, an electrically insulating layer and an electric element connected electrically to the electrically insulating layer are mounted on a rigid (great thickness) substrate.

OBJECT AND SUMMARY OF THE INVENTION

An object of the present invention is to provide a semiconductor module whose thickness is minimized while effectively shielding the semiconductor module from a magnetic and/or electric noise, and a producing method therefor.

According to the present invention, a semiconductor module comprises, at least one electric element including a semiconductor chip, an electrically conductive layer connected electrically to the electric element, an electrically conductive joint arranged between the electric element and the electrically conductive layer to connect electrically the electric element and the electrically conductive layer to each other, a molding resin covering at least partially the electric element and the electrically conductive joint, and an electrically insulating layer contacting at least partially the electrically conductive layer.

Since the electric element is supported on the electrically conductive layer and electrically insulating layer without a great thickness substrate, a thickness of the semiconductor module can be minimized.

If the electrically conductive layer includes a front surface and a reverse surface opposite to each other in a thickness direction of the electrically conductive layer, the front surface faces to the electric element (any intermediate member, for example, another electrically conductive layer, the electrically insulating layer, the molding resin, the electrically conductive joint or the like may be arranged between the front surface and the electric element so that the front surface faces to the electric element therethrough), the reverse surface is prevented from facing to the electric element, and a Nickel concentration at the reverse surface is higher than a Nickel concentration at the front surface, the electric element can be effectively shielded from a magnetic noise by the reverse surface of high Nickel concentration while a diffusion of Nickel from the electrically conductive layer to the electrically conductive joint is restrained.

If the electrically conductive layer includes a first layer of Nickel-base metal, and a second layer of Copper-base metal extends at least partially between the first layer and the electric element while being joined with the first layer, the electric element can be effectively shielded from a magnetic noise by the first layer while a diffusion of Nickel from the electrically conductive layer to the electrically conductive joint is restrained. When the electrically insulating layer is juxtaposed with a part of the second layer in a direction perpendicular to a thickness direction of the electrically conductive layer so that surfaces of the electrically insulating layer and the part of the second layer both prevented from facing to the electric element extend along a common flat face, the first layer can extend on the common flat face. When the first layer extends on the surface of the electrically insulating layer along the common flat face, the first layer for effectively shielding the electric element can extend over both the second layer and the electrically insulating layer. When a surface of the first layer prevented from facing to the electric element extends between the electric element and a surface of the electrically insulating layer prevented from facing to the electric element in a thickness direction of the electrically conductive layer, the surface of the first layer is securely protected by the surface of the electrically insulating layer. It is preferable for the semiconductor module to have a solder contacting a surface of the first layer prevented from facing to the electric element so that the surface of the first layer is protected by the solder.

If a film of Nickel-base metal extending on a surface of the electrically insulating layer prevented from facing to the electric element, the electric element can be effectively shielded from the magnetic noise by the film of Nickel-base metal while a diffusion of Nickel to the electrically conductive joint is restrained.

A metallic film electrically connected to the electrically conductive layer and/or magnetically permeable may extend on a surface of the electrically insulating layer prevented from facing to the electric element. The semiconductor module may comprises a plurality of the electric elements including the semiconductor chip and at least one of transistor, diode, electric resistance, inductor, capacitor, crystal-oscillator, filter, balun, antenna, a circuit module and an interface connector.

According to the present invention, a method for producing a semiconductor module, comprising the steps of: preparing a substrate including a metallic surface plated with Nickel-base metal to form a Nickel-base metal film on the metallic surface, forming an electrically insulating layer and an electrically conductive layer on the Nickel-base metal film, connecting electrically the electrically conductive layer to an electric element through an electrically conductive joint arranged between the electric element and the electrically conductive layer, covering at least a part of the electric element and at least a part of the electrically conductive joint with a molding resin, and subsequently, removing the Nickel-base metal film from the metallic surface so that a combination of the Nickel-base metal film, the electrically insulating layer, the electrically conductive layer, the electrically conductive joint and the molding resin is separated from the metallic surface.

Since the metallic surface is plated with Nickel-base (Nickel or Nickel base alloy) metal, the combination of the Nickel-base metal film, the electrically insulating layer, the electrically conductive layer, the electrically conductive joint and the molding resin can be easily and securely separated from the metallic surface at a boundary between the Nickel-base metal and the metallic surface.

In the step of forming the electrically insulating layer and the electrically conductive layer, it is preferable for easily forming a desired pattern of the electrically conductive layer that the electrically insulating layer is formed on a part of the Nickel-base metal film before the electrically conductive layer is formed on the Nickel-base metal film, and subsequently, another part of the Nickel-base metal film on which another part the electrically insulating layer is prevented from being arranged is plated with an electrically conductive material to form the electrically conductive layer on the Nickel-base metal film while the Nickel-base metal film is electrically energized to plate the Nickel-base metal film with the electrically conductive material.

In the step of forming the electrically insulating layer and the electrically conductive layer, it is preferable for easily forming a desired pattern of the electrically conductive layer extending on the electrically insulating layer that the electrically insulating layer is formed on a part of the Nickel-base metal film before the electrically conductive layer is formed on the Nickel-base metal film, a metallic film (of, for example, Copper-Chrome-base-alloy, Copper, Copper-base-alloy or the like) is formed by sputtering on the electrically insulating layer and another part of the Nickel-base metal film on which another part the electrically insulating layer is prevented from being arranged, and the metallic film is plated with an electrically conductive material to form the electrically conductive layer on the metallic film while the metallic film is electrically energized to plate the metallic film with the electrically conductive material.

It is preferable for easy and secure removal of the Nickel-base metal from the metallic surface that a thickness of the Nickel-base metal film is 5–20 $\mu$m.

It is preferable for protecting the Nickel-base metal film that another electrically insulating layer is formed on at least a part of a surface of the Nickel-base metal film after the surface of the Nickel-base metal film is exposed by removing the metallic surface from the surface of the Nickel-base metal film.

It is preferable for forming a desired pattern of the Nickel-base metal film that at least a part of the Nickel-base metal film is removed from the combination after the surface of the Nickel-base metal film is exposed by removing the metallic surface from the surface of the Nickel-base metal film. If another part of the Nickel-base metal film remains on a part of the electrically conductive layer and is electrically connected to the part of the electrically conductive layer while the another part of the Nickel-base metal film extends onto a part of the electrically insulating layer, after removing the part of the Nickel-base metal film from the combination, the Nickel-base metal film protects a boundary between the electrically conductive layer and the electrically insulating layer.

It is preferable for securely protecting the surface of the Nickel-base metal film that a solder is heated to be melt and subsequently cooled to be cured on at least a part of the Nickel-base metal film to fix the solder to the at least a part of the Nickel-base metal film after the surface of the Nickel-base metal film is exposed by removing the metallic from the surface of the Nickel-base metal film.

It is preferable for easily and securely separating the Nickel-base metal film from the metallic surface while easily forming the Nickel-base metal film of sufficient thickness that the metallic surface is a stainless steel surface.

It is preferable for preventing powder of the Nickel-base metal film from being scattered that a part of at least one of the electrically insulating layer and the electrically conductive layer is removed along a line on which the Nickel-base metal film is prevented from being arranged, after the Nickel-base metal film is removed from the metallic surface.

DETAILED DESCRIPTION OF PREFERRED EMBODIMENTS

First Embodiment of Semiconductor Module

Figure 1:
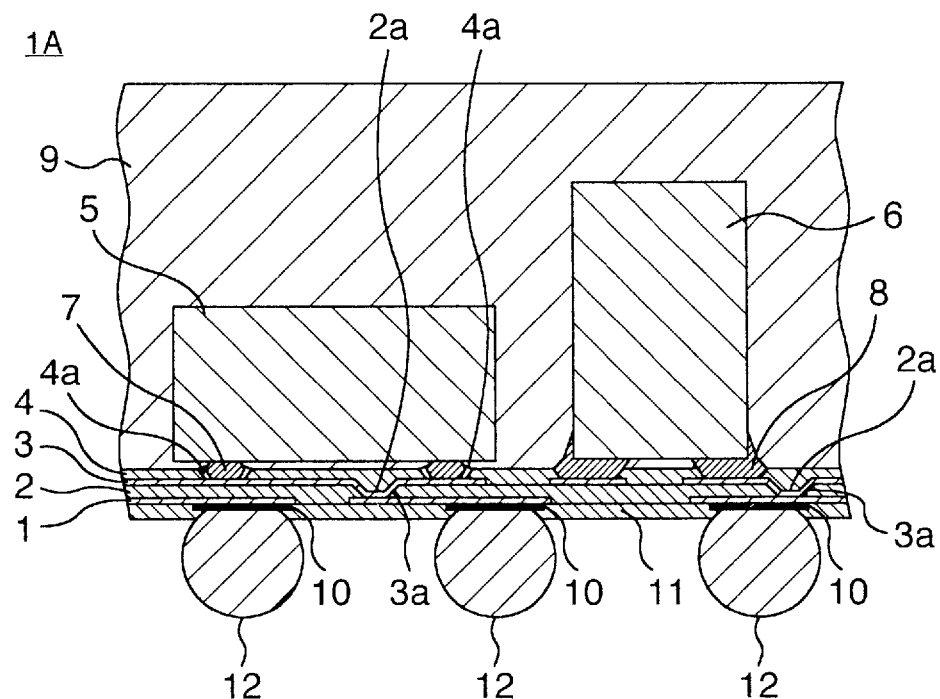
FIG. 1 is a cross sectional view showing a first embodiment of semiconductor module of the invention.

A semiconductor module 1A has, as shown in FIG. 1, a first electrically conductive (metallic) layer 1, a first electrically insulating layer 2, a second electrically conductive (metallic) layer 3, an electrically conductive connection 3a connecting electrically the first and second electrically conductive layers 1 and 3 to each other, a second electrically insulating layer 4, a semiconductor (IC or LSI) chip 5, an electrical circuit element 6, a first electrically conductive joint 7 connecting electrically the second electrically conductive layer 3 and semiconductor chip 5 to each other, a second electrically conductive joint 8 connecting electrically the second electrically conductive layer 3 and electrical circuit element 6 to each other, a monolithically extending molding resin 9 covering the semiconductor chip 5, electrical circuit element 6, first electrically conductive joint 7 and second electrically conductive joint 8 to be hermetically sealed, a Nickel (or metallic) layer 10 extending on a part of a surface of the first electrically conductive layer 1, a resin protecting layer 11 covering a region of the surface of the first electrically conductive layer 1 other than the part of the surface of the first electrically conductive layer 1, and exterior terminals 12 (preferably formed of solder) contacting the Nickel layer 10 for correctly forming the exterior terminals 12 thereon. The semiconductor module 1A is connected to an electrical device (for example, a printed wiring board) through the exterior terminals 12.

The first and second electrically conductive layers 1 and 3 and the electrically conductive connection 3a are formed by electroplating with copper or copper alloy, for example, Copper-Nickel type alloy or Copper-Nickel-Silver type alloy preferable for anti-corrosion and/or adhesion characteristic. The electrically conductive connection 3a extends through a first opening 2a of the first electrically insulating layer 2 to connect electrically the first and second electrically conductive layers 1 and 3 to each other. The first and second electrically conductive joints 7 and 8 extend though the second openings 4a of the second electrically insulating layer 4 to connect electrically the second electrically conductive layer 3 to the semiconductor chip 5 and electrical circuit element 6.

The first and second electrically insulating layers 2 and 4 and the resin protecting layer 11 are formed of an electrically insulating resin, for example, a photosensitive electrically insulating resin.

The semiconductor chip 5 may have a thickness decreased by a mechanical grinding and/or chemical polishing on a silicon wafer with the semiconductor chip 5. Input and output pads of the semiconductor chip 5 hold thereon the first electrically conductive joints 7 of gold bumps respectively.

The electrical circuit element 6 may include a transistor, diode, resistance, inductor, capacitor, crystal oscillator, filter, balun, antenna, a circuit module (for example, VCO, PLL or electric source regulator), and/or an interface connector.

The second electrically conductive joint 8 may be an electrically conductive paste, anisotropic electrically conductive adhesive or solder.

Since the first and second electrically conductive layers 1 and 3 and the first and second electrically insulating layers 2 and 4 support the semiconductor chip 5 and the electrical circuit element 6 in the semiconductor module 1A, a thickness of the semiconductor module 1A may be small. Since the first and second electrically conductive layers 1 and 3 are formed by the plating process, the first and second electrically conductive layers 1 and 3 can have a fine arrangement. Since the first and second electrically conductive layers 1 and 3 are stacked in a thickness direction of the semiconductor module 1A, an area of the first and second electrically conductive layers 1 and 3 as seen in the thickness direction of the semiconductor module 1A can be decreased.

Second Embodiment of Semiconductor Module

Figure 2:
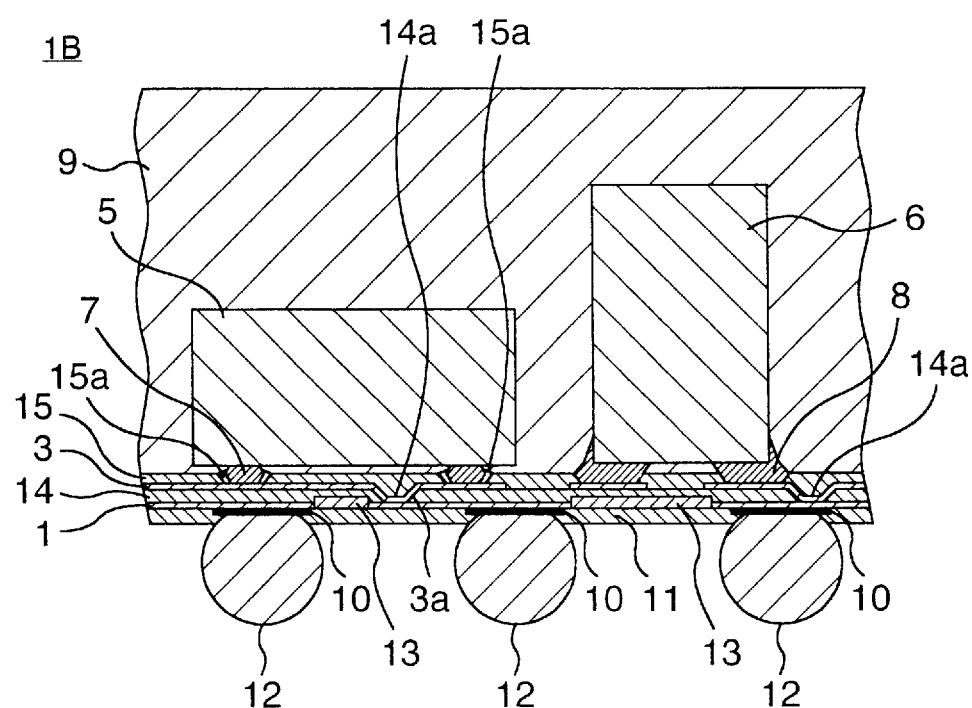
FIG. 2 is a cross sectional view showing a second embodiment of semiconductor module of the invention.

A semiconductor module 1B has, as shown in FIG. 2, a first electrically insulating layer 13, the first electrically conductive (metallic) layer 1, a second electrically insulating layer 14, the second electrically conductive (metallic) layer 3, the electrically conductive connection 3a connecting electrically the first and second electrically conductive layers 1 and 3 to each other, a third electrically insulating layer 15, the semiconductor (IC or LSI) chip 5, the electrical circuit element 6, the first electrically conductive joint 7 connecting electrically the second electrically conductive layer 3 and semiconductor chip 5 to each other, the second electrically conductive joint 8 connecting electrically the second electrically conductive layer 3 and electrical circuit element 6 to each other, the monolithically extending molding resin 9 covering the semiconductor chip 5, electrical circuit element 6, first electrically conductive joint 7 and second electrically conductive joint 8 to be hermetically sealed, the Nickel (or metallic) layer 10 extending on the part of the surface of the first electrically conductive layer 1, the resin protecting layer 11 covering the first electrically insulating layer 13 and the region of the surface of the first electrically conductive layer 1 other than the part of the surface of the first electrically conductive layer 1, and the exterior terminals 12 (preferably formed of solder) contacting the Nickel layer 10 for correctly forming the exterior terminals 12 thereon.

The electrically conductive connection 3a extends through a first opening 14a of the second electrically insulating layer 14 to connect electrically the first and second electrically conductive layers 1 and 3 to each other. The first and second electrically conductive joints 7 and 8 extend though second openings 15a of the third electrically insulating layer 15 to connect electrically the second electrically conductive layer 3 to the semiconductor chip 5 and electrical circuit element 6.

An electrically insulating resin forming the first electrically insulating layer 13 may be different from an electrically insulating resin forming the second and third electrically insulating layers 14 and 15, or identical with the electrically insulating resin forming the second and third electrically insulating layers 14 and 15. Parts of surfaces of the first electrically insulating layer 13 and the first electrically conductive layer 1 extend along a common flat face, as parts of surfaces of the first electrically conductive layer 1 and the first electrically insulating layer 2 extend along a common flat face.

Third Embodiment of Semiconductor Module

Figure 3:
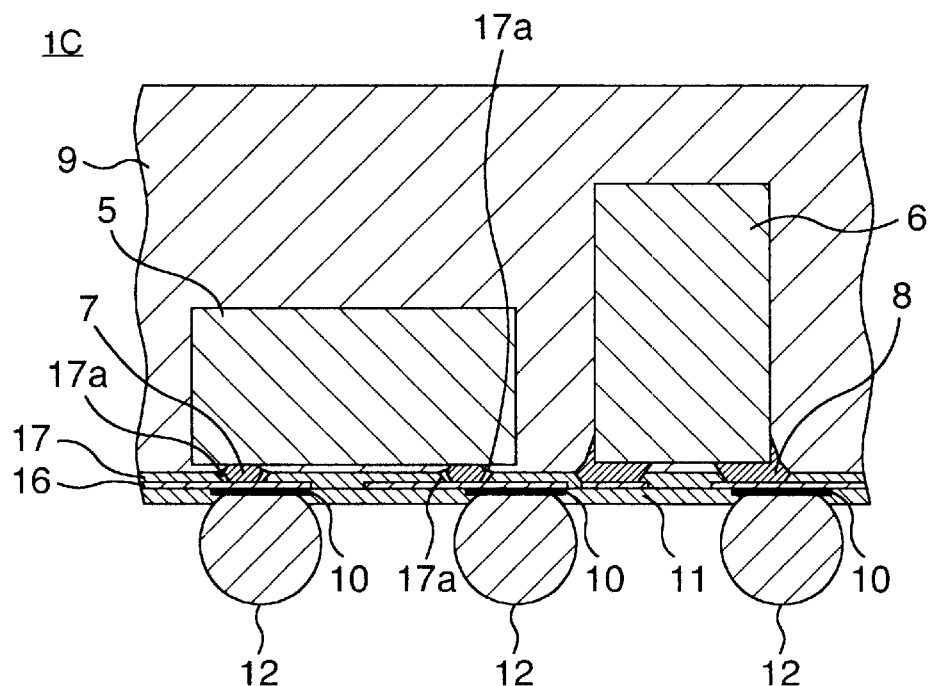
FIG. 3 is a cross sectional view showing a third embodiment of semiconductor module of the invention.

A semiconductor module 1C has, as shown in FIG. 3, an electrically conductive (metallic) layer 16, an electrically insulating layer 17, the semiconductor (IC or LSI) chip 5, the electrical circuit element 6, the first electrically conductive joint 7 connecting electrically the electrically conductive layer 16 and semiconductor chip 5 to each other, the second electrically conductive joint 8 connecting electrically the electrically conductive layer 16 and electrical circuit element 6 to each other, the monolithically extending molding resin 9 covering the semiconductor chip 5, electrical circuit element 6, first electrically conductive joint 7 and second electrically conductive joint 8 to be hermetically sealed, the Nickel (or metallic) layer 10 extending on a part of a surface of the electrically conductive layer 16, the resin protecting layer 11 covering a region of the surface of the electrically conductive layer 16 other than the part of the surface of the electrically conductive layer 16, and the exterior terminals 12 (preferably formed of solder) contacting the Nickel layer 10 for correctly forming the exterior terminals 12 thereon.

The first and second electrically conductive joints 7 and 8 extend though openings 17a of the electrically insulating layer 17 to connect electrically the electrically conductive layer 16 to the semiconductor chip 5 and electrical circuit element 6. Parts of surfaces of the electrically insulating layer 17 and the electrically conductive layer 16 extend along a common flat face.

Fourth Embodiment of Semiconductor Module

Figure 4:
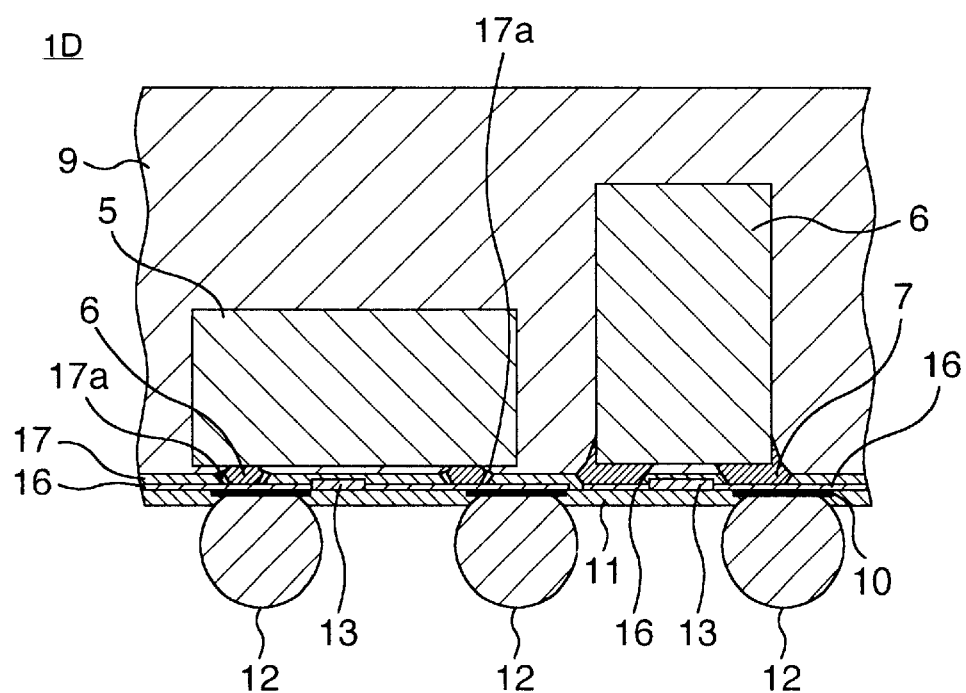
FIG. 4 is a cross sectional view showing a fourth embodiment of semiconductor module of the invention.

A semiconductor module 1D has, as shown in FIG. 4, the first electrically insulating layer 13, an electrically conductive (metallic) layer 16, a second electrically insulating layer 17, the semiconductor (IC or LSI) chip 5, the electrical circuit element 6, the first electrically conductive joint 7 connecting electrically the electrically conductive layer 16 and semiconductor chip 5 to each other, the second electrically conductive joint 8 connecting electrically the electrically conductive layer 16 and electrical circuit element 6 to each other, the monolithically extending molding resin 9 covering the semiconductor chip 5, electrical circuit element 6, first electrically conductive joint 7 and second electrically conductive joint 8 to be hermetically sealed, the Nickel (or metallic) layer 10 extending on the part of the surface of the electrically conductive layer 16, the resin protecting layer 11 covering the electrically insulating layer 13 and the region of the surface of the electrically conductive layer 16 other than the part of the surface of the electrically conductive layer 16, and the exterior terminals 12 (preferably formed of solder) contacting the Nickel layer 10 for correctly forming the exterior terminals 12 thereon.

An electrically insulating resin forming the first electrically insulating layer 13 may be different from an electrically insulating resin forming the second electrically insulating layer 16, or identical with the electrically insulating resin forming the second electrically insulating layer 16. Parts of surfaces of the first electrically insulating layer 13 and the electrically conductive layer 16 extend along a common flat face. The first and second electrically conductive joints 7 and 8 extend though openings 17a of the second electrically insulating layer 17 to connect electrically the electrically conductive layer 16 to the semiconductor chip 5 and electrical circuit element 6.

Fifth Embodiment of Semiconductor Module

Figure 5A:
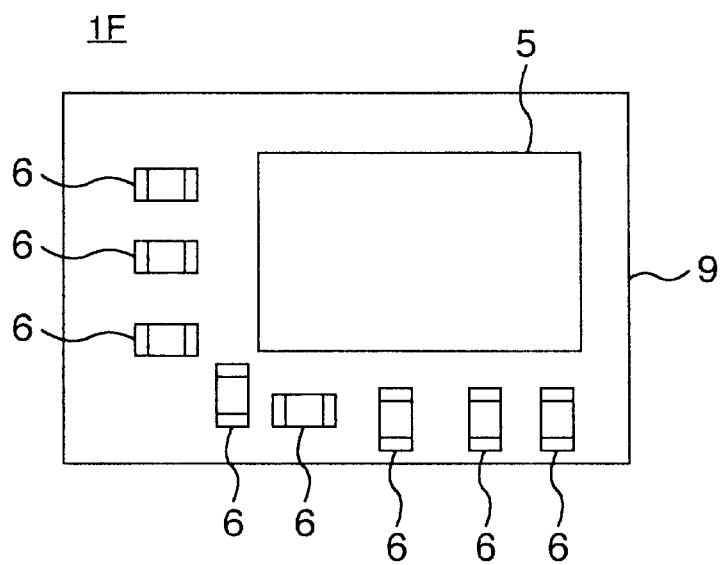
FIG. 5a is a front view showing a fifth embodiment of semiconductor module of the invention.
Figure 5B:
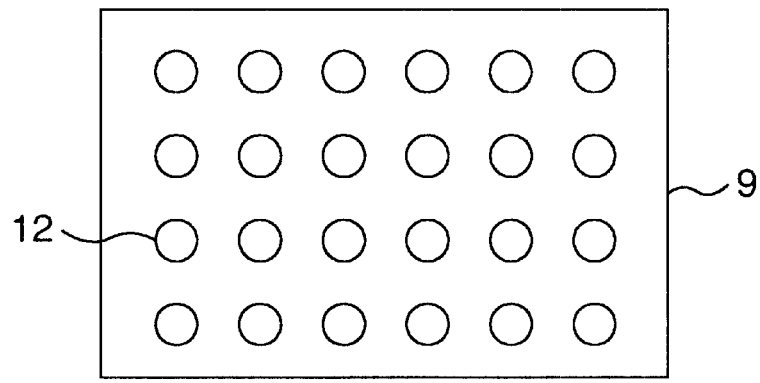
FIG. 5b is a reverse view showing a fifth embodiment of semiconductor module of the invention.
Figure 5C:
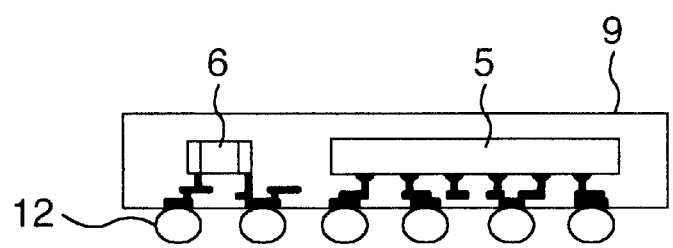
FIG. 5c is a cross sectional schematic view showing a fifth embodiment of semiconductor module of the invention.

A semiconductor module 1E may have, as shown in FIGS. 5a–5c, the semiconductor chip 5 and the eight electrical circuit elements 6.

Sixth Embodiment of Semiconductor Module

Figure 6A:
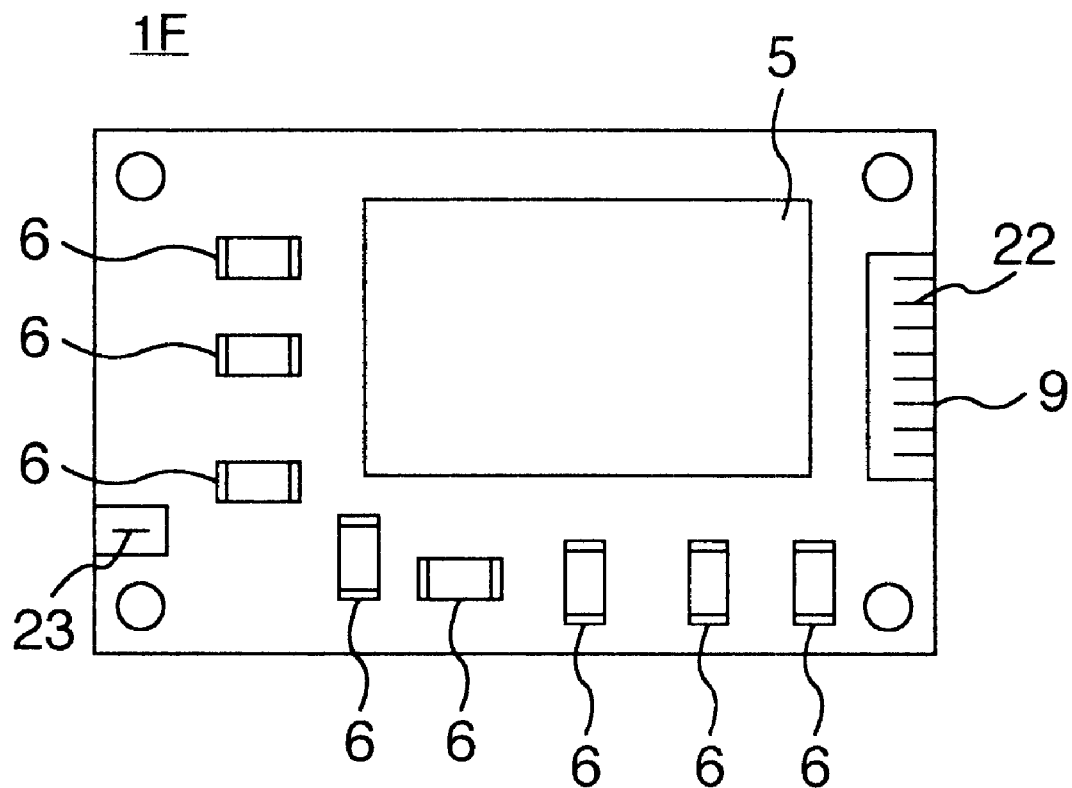
FIG. 6a is a front view showing a sixth embodiment of semiconductor module of the invention.
Figure 6B:
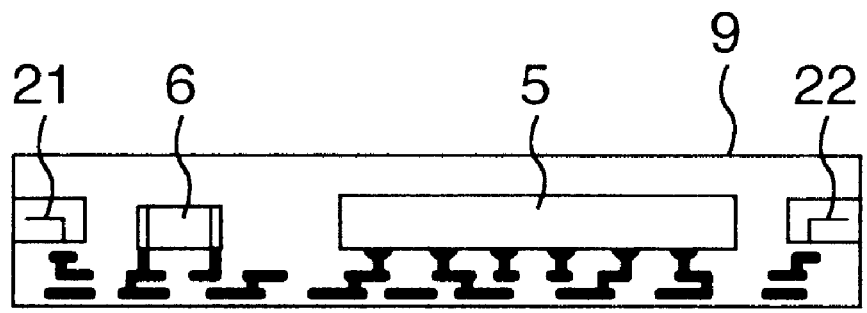
FIG. 6b is a cross sectional schematic view showing the sixth embodiment of semiconductor module of the invention.

A semiconductor module 1F may have, as shown in FIGS. 6a and 6b, the semiconductor chip 5, the eight electrical circuit elements 6, an interface connector 21 with one terminal and another interface connector 22 with 32 terminals.

Seventh Embodiment of Semiconductor Module

Figure 7A:
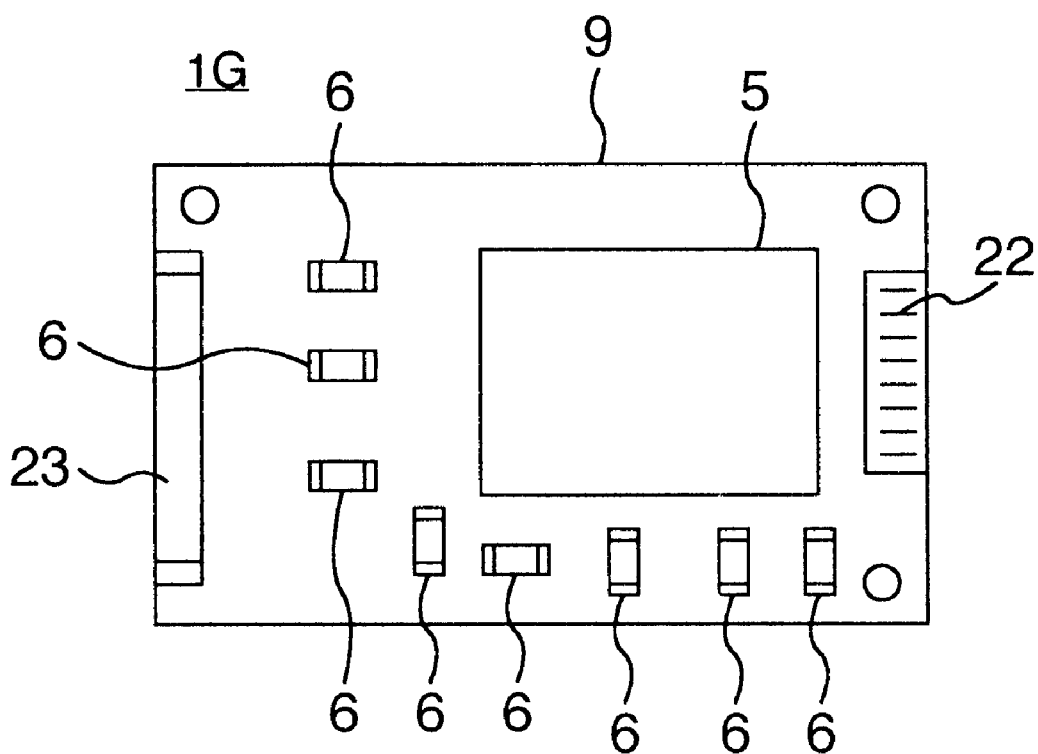
FIG. 7a is a front view showing a seventh embodiment of semiconductor module of the invention.
Figure 7B:
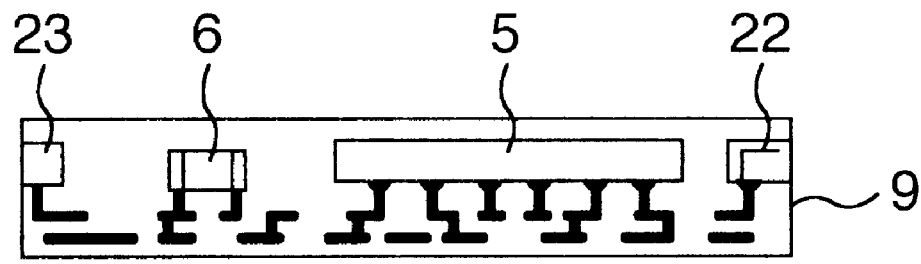
FIG. 7b is a cross sectional schematic view showing the seventh embodiment of semiconductor module of the invention.

A semiconductor module 1G may have, as shown in FIGS. 7a and 7b, the semiconductor chip 5, the eight electrical circuit elements 6, the another interface connector 22 with 32 terminals, and a chip antenna 23.

Eighth Embodiment of Semiconductor Module

Figure 8A:
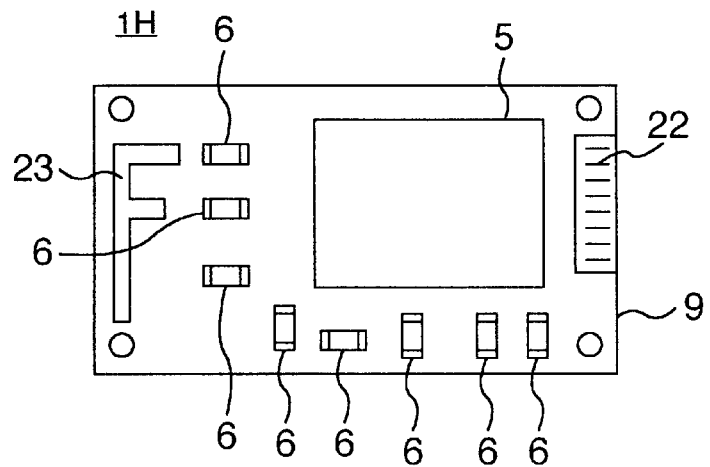
FIG. 8a is a front view showing an eighth embodiment of semiconductor module of the invention.
Figure 8B:
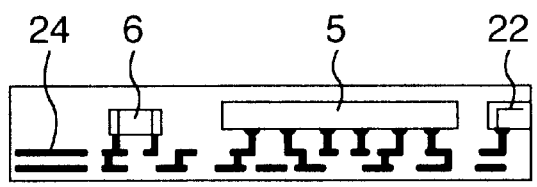
FIG. 8b is a cross sectional schematic view showing the eighth embodiment of semiconductor module of the invention.

A semiconductor module 1H may have, as shown in FIGS. 8a and 8b, the semiconductor chip 5, the eight electrical circuit elements 6, the another interface connector 22 with 32 terminals, and F-shaped flat antennas (inductive and capacitive lines) 24 extending respectively along planes on which the first and second electrically conductive layers 1 and 3 extend respectively.

Ninth Embodiment of Semiconductor Module

Figure 9:
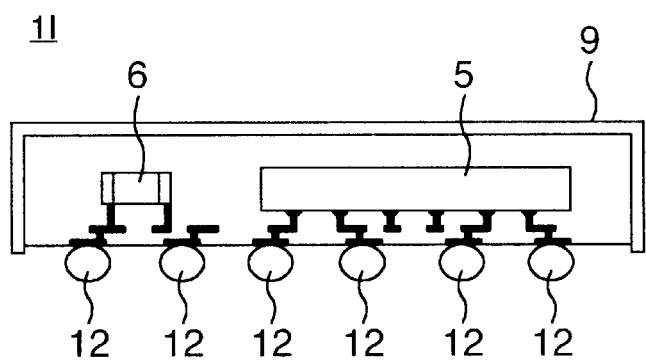
FIG. 9 is a cross sectional schematic view showing a ninth embodiment of semiconductor module of the invention.

A semiconductor module 1I may have, as shown in FIG. 9, a metallic coating film 25 on the molding resin 9 for shielding the semiconductor chip 5 and eight electrical circuit elements 6 from a high-frequency noise.

Tenth Embodiment of Semiconductor Module

Figure 10A:
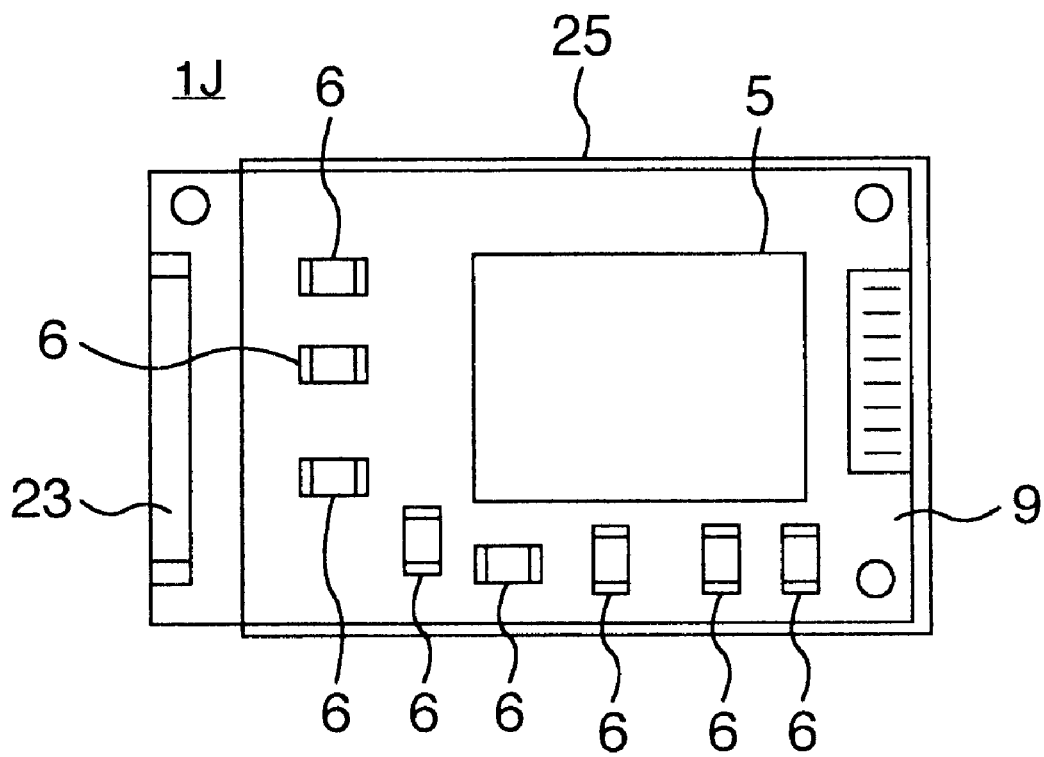
FIG. 10a is a front view showing a tenth embodiment of semiconductor module of the invention.
Figure 10B:
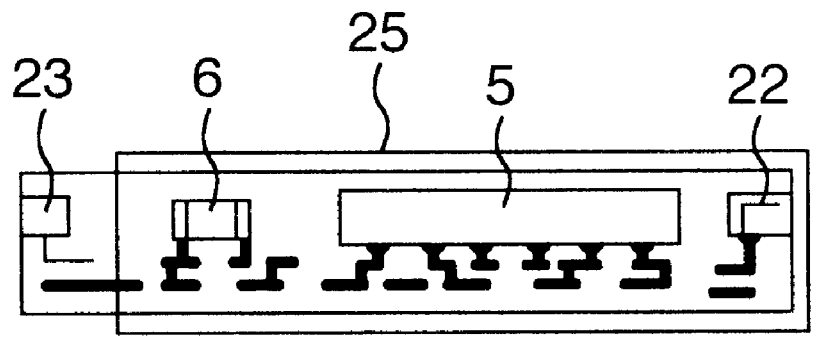
FIG. 10b is a cross sectional schematic view showing the tenth embodiment of semiconductor module of the invention.

A semiconductor module 1J may have, as shown in FIGS. 10a and 10b, the metallic coating film 25 on the molding resin 9 and the protecting layer 11 for shielding the semiconductor chip 5 and eight electrical circuit elements 6 from the high-frequency noise.

If the semiconductor module includes the antenna 23 or 24, the metallic coating film 25 is prevented from covering the antenna 23 or 24.

Eleventh Embodiment of Semiconductor Module

Figure 11:
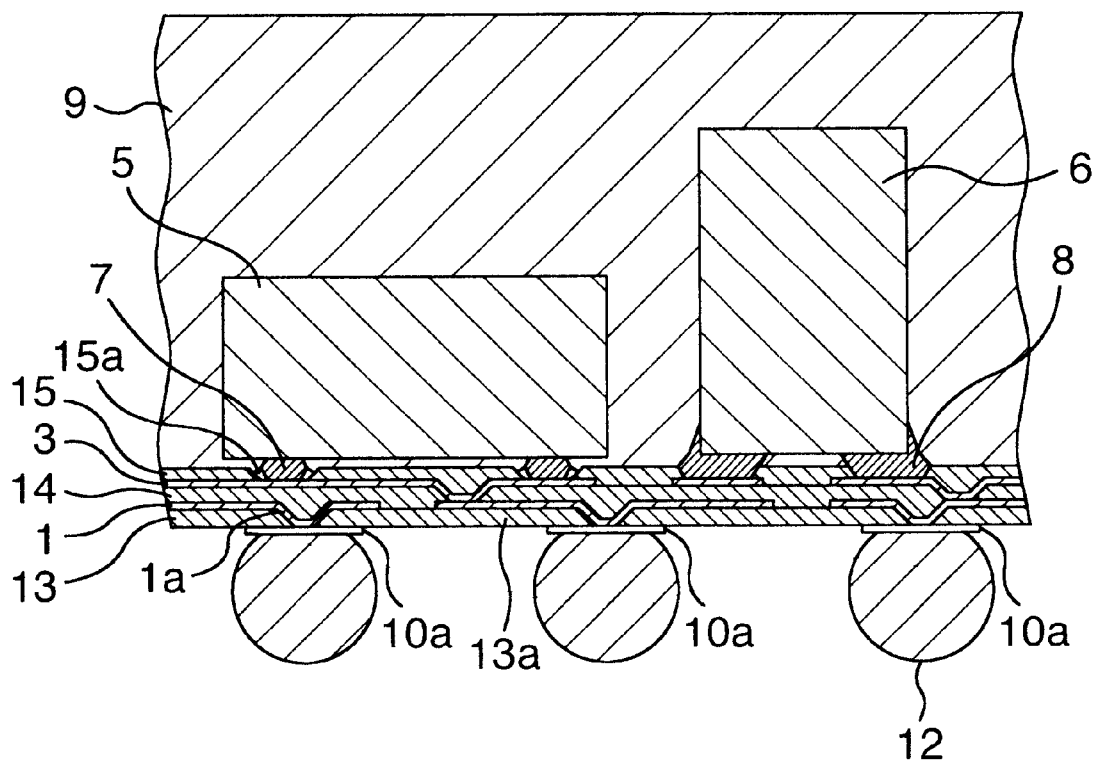
FIG. 11 is a cross sectional schematic view showing an eleventh embodiment of semiconductor module of the invention.
Figure 12A:
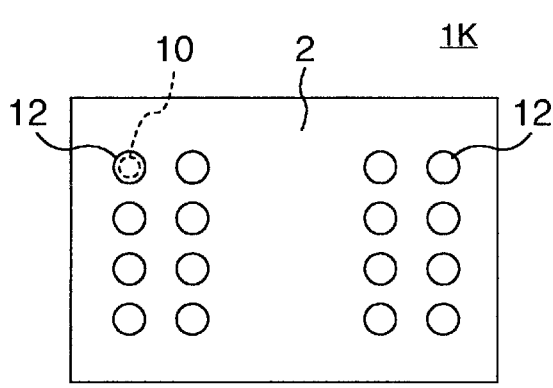
FIGS. 12a–12e are schematic reverse views of modified eleventh embodiments of semiconductor module of the invention.

As shown in FIGS. 11 and 12a, in a semiconductor module 1K, the Nickel (or metallic) layer 10 may extend on parts of a surface of the electrically insulating layer 13 and an electrically conductive connection 1a extending along a common flat face to enlarge an electrically conductive area of the Nickel layer 10 capable of contacting the exterior terminals 12. The electrically conductive connection 1a extends through an opening 13a of the electrically insulating layer 13 to connect electrically the electrically conductive layer 1 through the Nickel layer 10 to the exterior terminals 12 contacting the Nickel layer 10. As shown in FIGS. 12b–12e, a Nickel (or metallic) layer 10a may extend on a region of the surface of the electrically insulating layer 13 other than the parts of the surface of the electrically insulating layer 13 while the Nickel layer 10a is prevented from being electrically connected to the electrically conductive connection 1a.

Figure 12D:
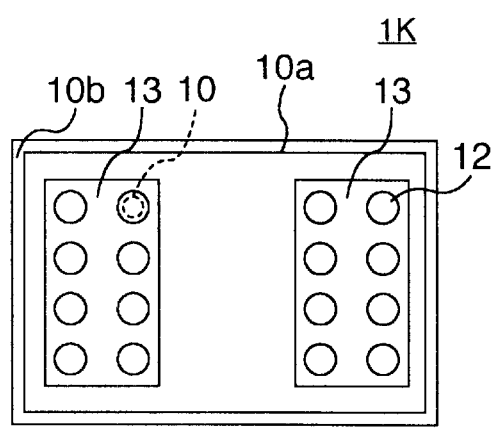
Figure 12B:
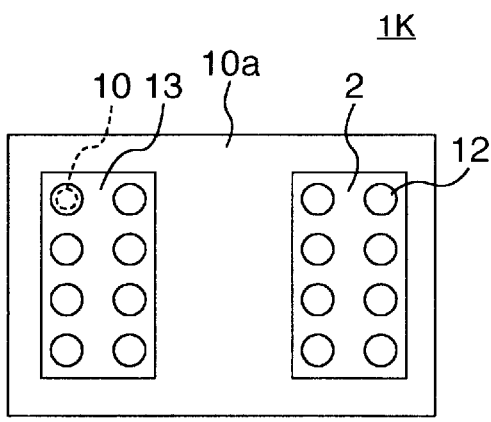
Figure 12E:
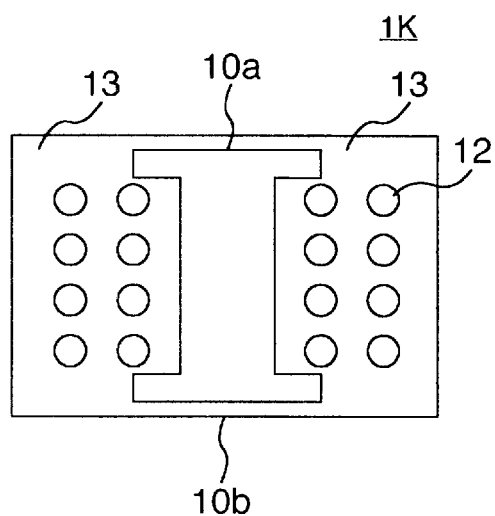
Figure 12C:
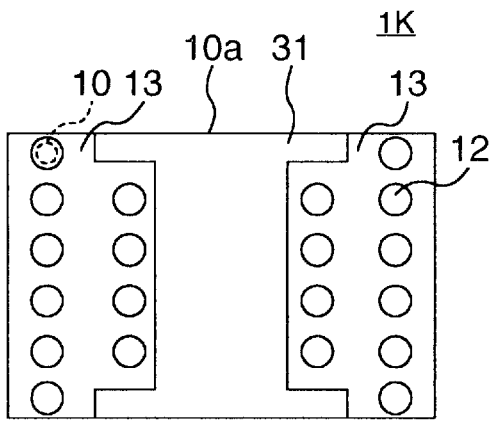

If the Nickel layer 10a is prevented from extending at least partially to an outer periphery of the electrically insulating layer 13, as shown in FIGS. 12c–12e, an electric connection through the Nickel layer 10a between the semiconductor modules adjacent to each other is restrained. If the semiconductor module includes the antenna 23 or 24, the Nickel layer 10a is prevented from covering the antenna 23 or 24. The Nickel layer 10a shields the semiconductor chip 5 and electrical circuit element 6 from the high-frequency noise.

First Embodiment of Semiconductor Module Producing Method

Figure 13:
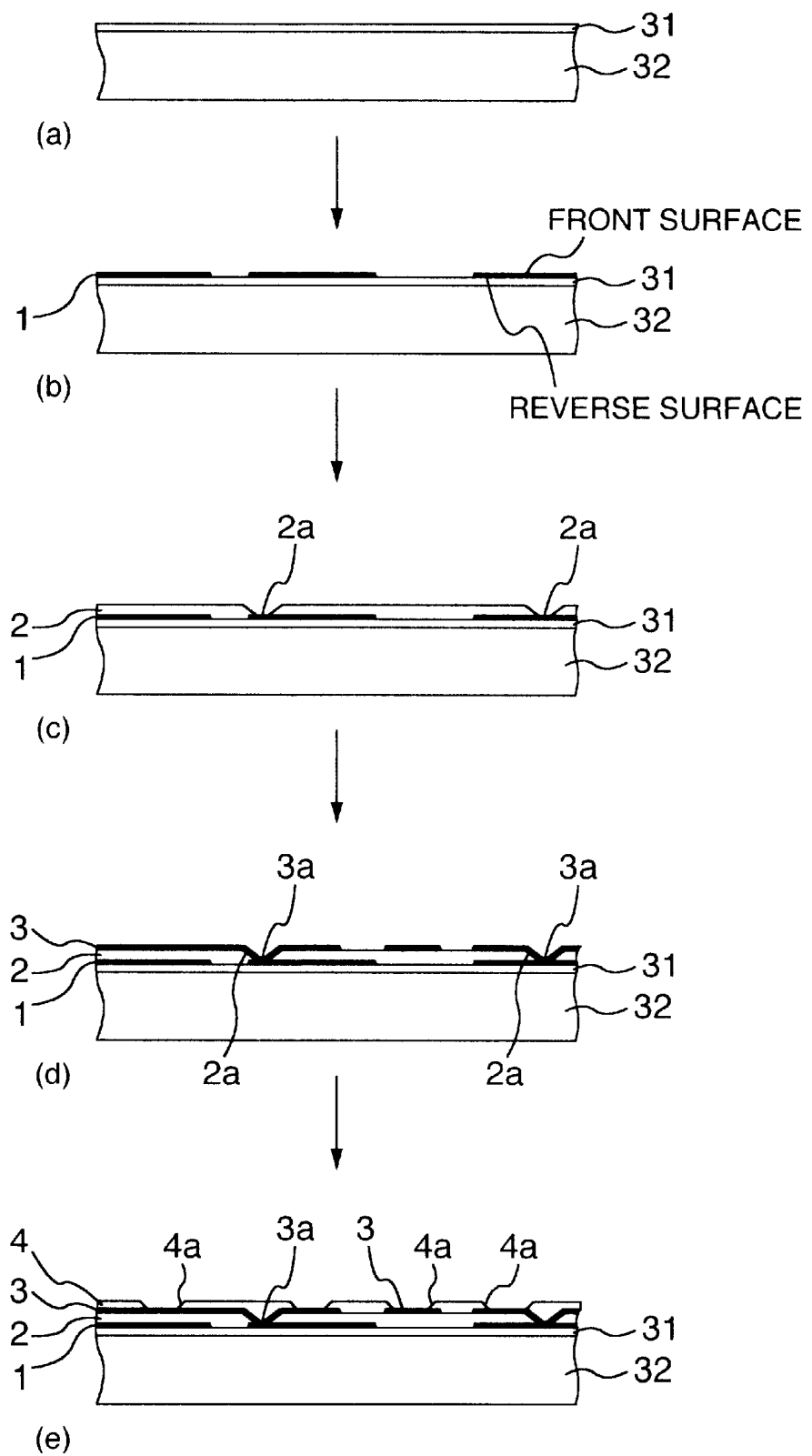
FIG. 13 includes schematic side views showing a manufacturing proceeding of a semiconductor module producing method of the invention.
Figure 14:
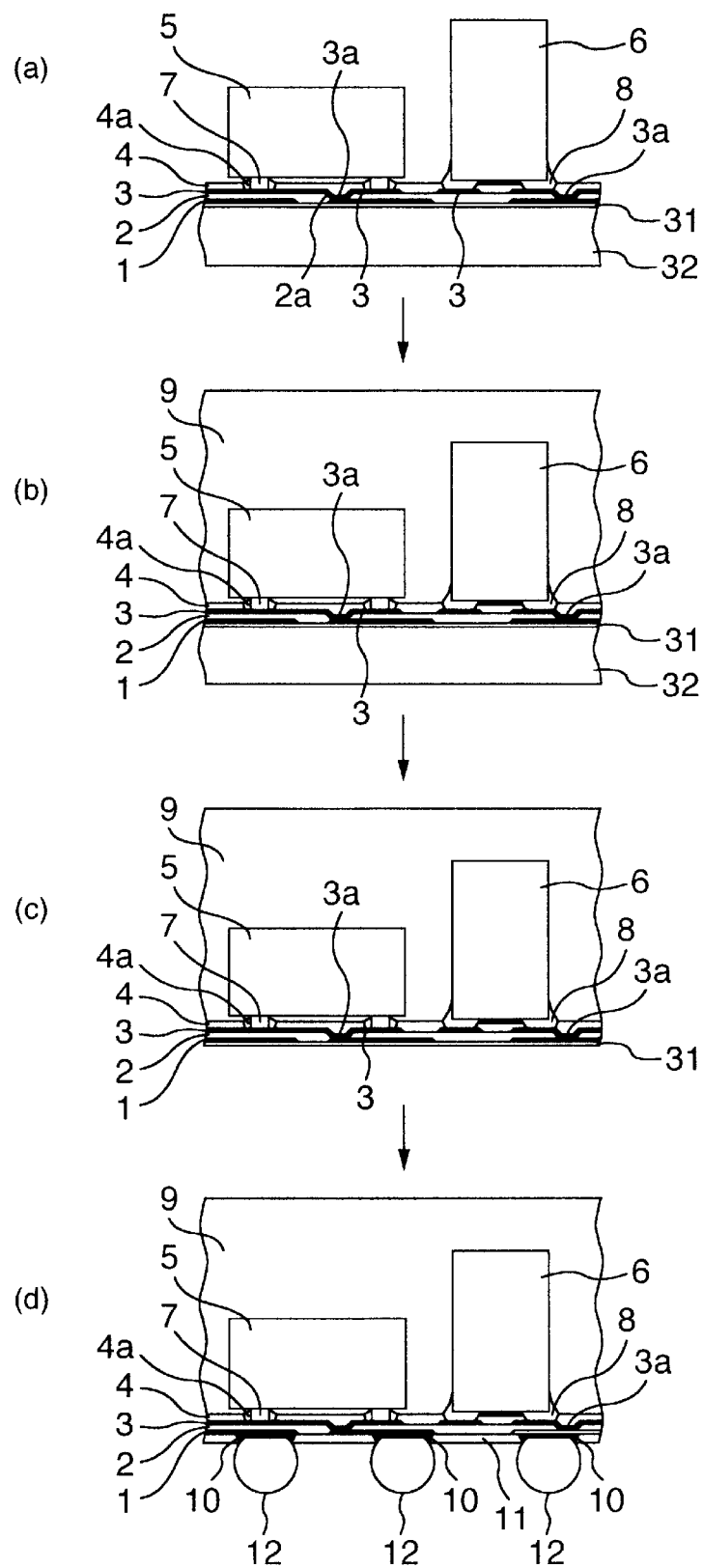
FIG. 14 includes schematic side views showing a manufacturing proceeding of a semiconductor module producing method of the invention.

A proceeding in a semiconductor module producing method is shown in FIGS. 13 and 14. At first step, as shown in part (a) of FIG. 13, a temporary or removable substrate 32 of stainless-steel is plated with Nickel or Nickel-base-alloy to form a Nickel layer 31 of 10 µm thickness on the temporary substrate 32 of 0.3 mm thickness.

Subsequently, as shown in part (b) of FIG. 13, the first electrically conductive layer 1 of desirable electrical wiring pattern is formed on the Nickel layer 31, by coating a surface of the Nickel layer 31 with a photoresist, exposing the photoresist through a mask corresponding to the desirable electrical wiring pattern of the first electrically conductive layer 1, developing the photoresist by removing a part of the photoresist not cured to form a surface region on which the first electrically conductive layer 1 should be formed, plating the Nickel layer 31 with Copper or Copper-base-alloy while supplying an electric power for the plating to the Nickel layer 31, and removing another cured part of the photoresist together with the Copper or Copper-base-alloy thereon.

Subsequently, as shown in part (c) of FIG. 13, the first electrically insulating layer 2 with openings 2a therethrough is formed on the Nickel layer 31 and the first electrically conductive layer 1, by coating a surface of the Nickel layer 31 and first electrically conductive layer 1 with a photosensitive electrically insulating resin, exposing the photosensitive electrically insulating resin through another mask corresponding to a desirable pattern of the first electrically insulating layer 2 with the openings 2a, and developing the photosensitive electrically insulating resin by removing a part of the photosensitive electrically insulating resin not cured to form the openings 2a surrounded by the cured part of the photosensitive electrically insulating resin as the first electrically insulating layer 2. In this arrangement, if the semiconductor chip 5 and electrical circuit element 6 are mounted on the first electrically insulating layer 2 and connected electrically to the first electrically conductive layer 1 through the first electrically conductive joint 7 and second electrically conductive joint 8, and the semiconductor chip 5, electrical circuit element 6, first electrically conductive joint 7 and second electrically conductive joint 8 are covered by the monolithically extending molding resin 9, the third embodiment of semiconductor module is formed.

Subsequently, as shown in part (d) of FIG. 13, the second electrically conductive layer 3 of desirable electrical wiring pattern is formed on the first electrically insulating layer 2 and the electrically conductive connection 3a is formed on the first electrically conductive layer 1 through the openings 2a, by coating the first electrically insulating layer 2, the first electrically conductive layer 1 in the openings 2a and the openings 2a with Copper or Copper-base-alloy through sputtering process, removing partially by etching the Copper or Copper-base-alloy formed through sputtering process to leave the desirable electrical wiring pattern thereof, and subsequently plating a left region of Copper or Copper-base-alloy of the desirable electrical wiring pattern on the first electrically insulating layer 2, the first electrically conductive layer 1 in the openings 2a and the openings 2a with Copper or Copper-base-alloy while supplying an electric power for the plating to the Copper or Copper-base-alloy coating made by the sputtering process.

Subsequently, as shown in part (e) of FIG. 13, the second electrically insulating layer 4 with the openings 4a therethrough is formed on the second electrically conductive layer 3, the electrically conductive connection 3a and the first electrically insulating layer 2, by coating a surface of the second electrically conductive layer 3, the electrically conductive connection 3a and the first electrically insulating layer 2 with a photosensitive electrically insulating resin, exposing the photosensitive electrically insulating resin through another mask corresponding to a desirable pattern of the second electrically insulating layer 4 with the openings 4a, and developing the photosensitive electrically insulating resin by removing a part of the photosensitive electrically insulating resin not cured to form the openings 4a surrounded by the cured part of the photosensitive electrically insulating resin as the second electrically insulating layer 4. The flat antennas 24 may be formed simultaneously with forming the first and second electrically conductive layer 1 and 3.

Subsequently, as shown in part (a) of FIG. 14, the second electrically conductive layer 3 is electrically connected to the semiconductor chip 5 by inserting the gold bumps 7 of the semiconductor chip 5 into the openings 4a, and heating the gold bumps 7 while generating a compression force between the second electrically conductive layer 3 and the semiconductor chip 5, and is electrically connected to the electrical circuit element 6 by inserting the solder 8 between the openings 4a and terminals of the electrical circuit element 6 and heating the solder 8.

Subsequently, as shown in part (b) of FIG. 14, the semiconductor chip 5, electrical circuit element 6, first electrically conductive joint 7 and second electrically conductive joint 8 are covered by the molding resin 9 to be hermetically sealed.

Subsequently, as shown in part (c) of FIG. 14, the Nickel layer 31 is removed from the temporary substrate 32 to be exposed.

Subsequently, as shown in part (d) of FIG. 14, the Nickel layer 31 is partially removed to leave the Nickel layer 10 on the first electrically conductive layer 1, by coating the Nickel layer 31 with the photoresist, exposing the photoresist through a mask corresponding to a desirable pattern of the Nickel layer 10 to be left, developing the photoresist by removing a not-cured part of the photoresist, removing through etching the Nickel layer 31 exposed by removing the not-cured part of the photoresist to form the Nickel layer 10, and removing a cured part of the photoresist on the left Nickel layer 10. A region of the first electrically conductive layer 1 and first electrically insulating layer 2 which is not covered by the Nickel layer 10 is covered by the protecting layer 11.

Figures 15, 16:
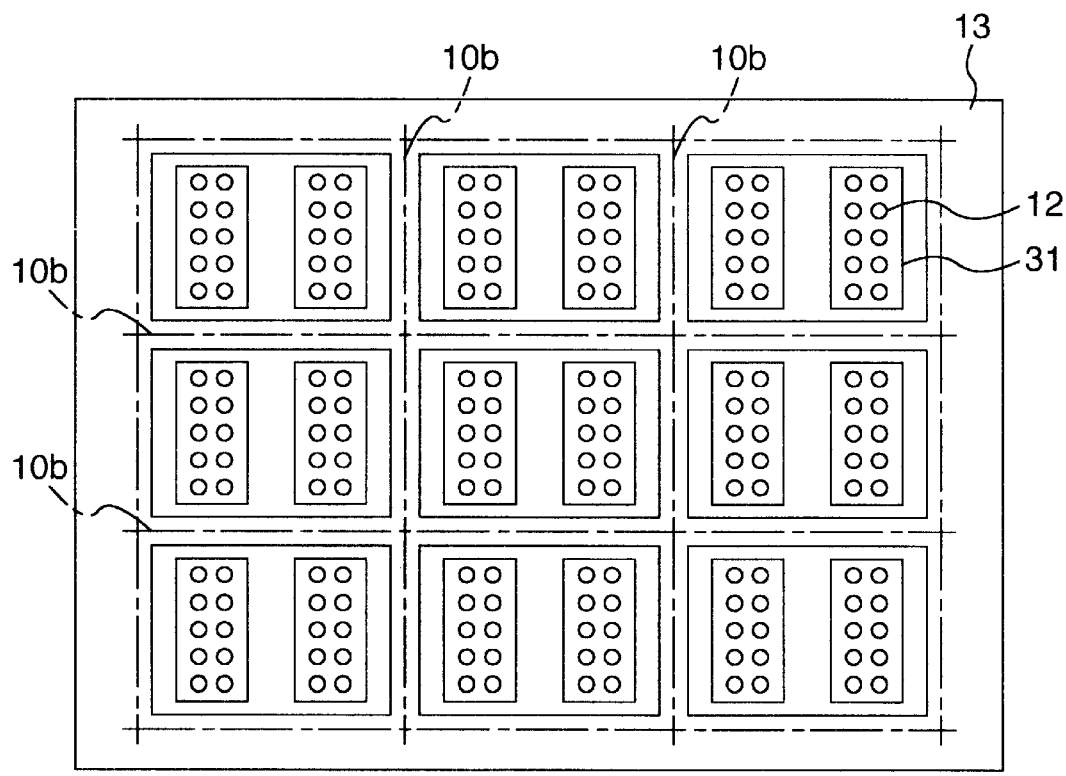
FIG. 15 is a table showing a relationship among a nickel plating thickness, a crack of nickel plating, and a curvature of a stainless steel.
FIG. 16 is a schematic view showing a nickel plating on a temporary substrate.

As shown in FIG. 15, it is preferable for the thickness of the Nickel layer 31 to be 5–20 μm when the thickness of the temporary substrate 32 is 0.3 mm.

If an adhering strength between the first electrically conductive layer 1 and first electrically insulating layer 2 is significantly great, the Nickel layer 31 may be eliminated. The metallic coating film 25 may be formed on the molding resin 9 and/or the protecting layer 11 by sputtering or the like.

A plurality of the semiconductor modules may be formed on the temporary substrate 32, and the semiconductor modules may be separated from each other after the semiconductor modules are covered monolithically by forming the protecting layer 11 on the semiconductor modules. In this case, as shown in FIG. 16, it is preferable for the Nickel layer 31 to be removed from a surface region (including a cutting line denoted by an alternate short and long dash line) of the electrically conductive layer and/or electrically insulating layer at which surface region the semiconductor modules are separated from each other, so that the Nickel layer 31 is prevented from being cut when the semiconductor modules are separated from each other.

Second Embodiment of Semiconductor Module Producing Method

Figure 17:
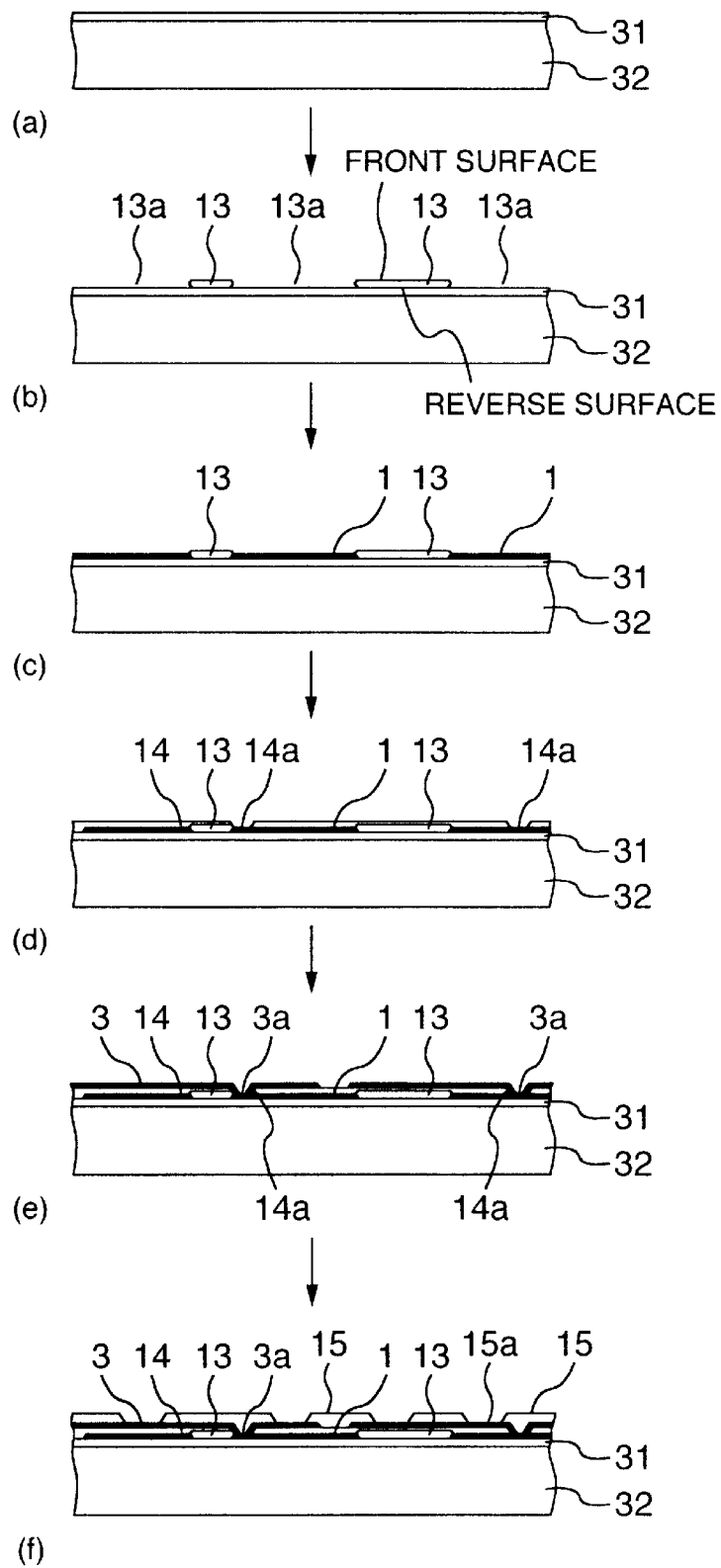
FIG. 17 includes schematic side views showing a manufacturing proceeding of a semiconductor module producing method of the invention.

A proceeding in a semiconductor module producing method is shown in FIG. 17. At first step, as shown in part (a) of FIG. 17, the temporary substrate 32 of stainless-steel is plated with Nickel or Nickel-base-alloy to form the Nickel layer 31 of 10 μm thickness on the temporary substrate 32 of 0.3 mm thickness.

Subsequently, as shown in part (b) of FIG. 17, the first electrically insulating layer 13 with the openings 13a therethrough is formed on the Nickel layer 31, by coating the surface of the Nickel layer 31 with the photosensitive electrically insulating resin, exposing the photosensitive electrically insulating resin through a mask corresponding to a desirable pattern of the first electrically insulating layer 13 with the openings 13a, and developing the photosensitive electrically insulating resin by removing a not cured part of the photosensitive electrically insulating resin to form the openings 13a surrounded by the cured part of the photosensitive electrically insulating resin as the first electrically insulating layer 13.

Subsequently, as shown in part (c) of FIG. 17, the first electrically conductive layer 1 is formed in the openings 13a on the Nickel layer 31, by plating a surface region of the Nickel layer 31 exposed by the openings 13a with Copper or Copper-base-alloy while supplying the electric power for the plating to the Nickel layer 31. Another surface region of the Nickel layer 31 covered by the first electrically insulating layer 13 is prevented from being plated.

Subsequently, as shown in part (d) of FIG. 17, the second electrically insulating layer 14 with the openings 14a therethrough is formed on the first electrically conductive layer 1 and the first electrically insulating layer 13, by coating a surface of the first electrically conductive layer 1 and the first electrically insulating layer 13 with the photosensitive electrically insulating resin, exposing the photosensitive electrically insulating resin through another mask corresponding to a desirable pattern of the second electrically insulating layer 14 with the openings 14a, and developing the photosensitive electrically insulating resin by removing a part of the photosensitive electrically insulating resin not cured to form the openings 14a surrounded by the cured part of the photosensitive electrically insulating resin as the second electrically insulating layer 14. In this arrangement, if the semiconductor chip 5 and electrical circuit element 6 are mounted on the first electrically insulating layer 13 and connected electrically to the first electrically conductive layer 1 through the first electrically conductive joint 7 and second electrically conductive joint 8, and the semiconductor chip 5, electrical circuit element 6, first electrically conductive joint 7 and second electrically conductive joint 8 are covered by the monolithically extending molding resin 9, the fourth embodiment of semiconductor module is formed.

Subsequently, as shown in part (e) of FIG. 17, the second electrically conductive layer 3 of desirable electrical wiring pattern is formed on the second electrically insulating layer 14 and the electrically conductive connection 3a is formed on the first electrically conductive layer 1 through the openings 14a, by coating the second electrically insulating layer 14, the first electrically conductive layer 1 in the openings 14a and the openings 14a with Copper or Copper-base-alloy through sputtering process, removing partially by etching the Copper or Copper-base-alloy formed through sputtering process to leave the desirable electrical wiring pattern thereof, and subsequently plating a left region of Copper or Copper-base-alloy of the desirable electrical wiring pattern on the second electrically insulating layer 14, the first electrically conductive layer 1 in the openings 14a and the openings 14a with Copper or Copper-base-alloy while supplying the electric power for the plating to the Copper or Copper-base-alloy coating made by the sputtering process.

Subsequently, as shown in part (f) of FIG. 17, the third electrically insulating layer 15 with the openings 15a therethrough is formed on the second electrically conductive layer 3, the electrically conductive connection 3a and the second electrically insulating layer 14, by coating a surface of the second electrically conductive layer 3, the electrically conductive connection 3a and the second electrically insulating layer 14 with the photosensitive electrically insulating resin, exposing the photosensitive electrically insulating resin through another mask corresponding to a desirable pattern of the third electrically insulating layer 15 with the openings 15a, and developing the photosensitive electrically insulating resin by removing a part of the photosensitive electrically insulating resin not cured to form the openings 15a surrounded by the cured part of the photosensitive electrically insulating resin as the third electrically insulating layer 15.

Third Embodiment of Semiconductor Module Producing Method

Figure 18:
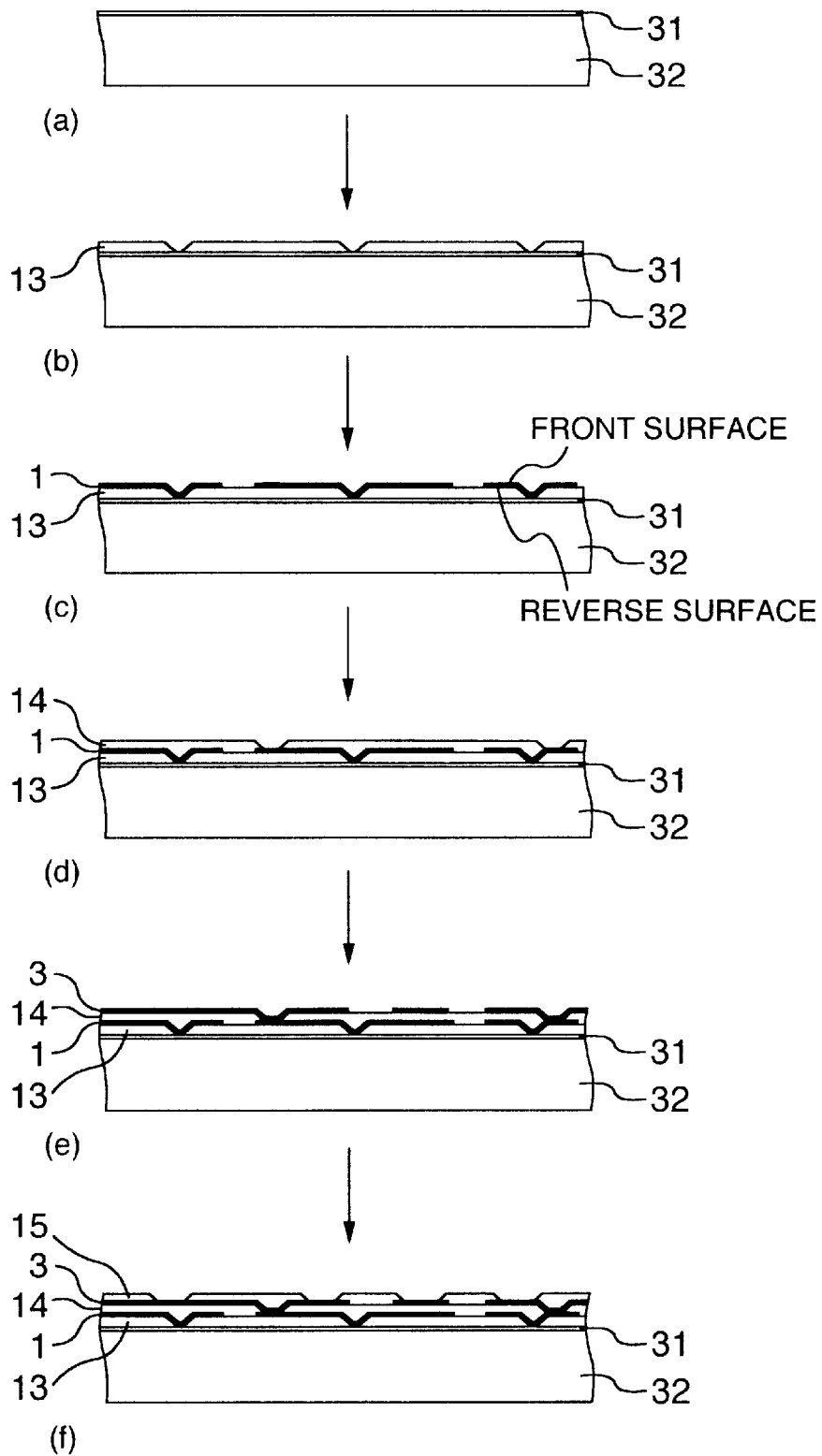
FIG. 18 includes schematic side views showing a manufacturing proceeding of a semiconductor module producing method of the invention.
Figure 19:
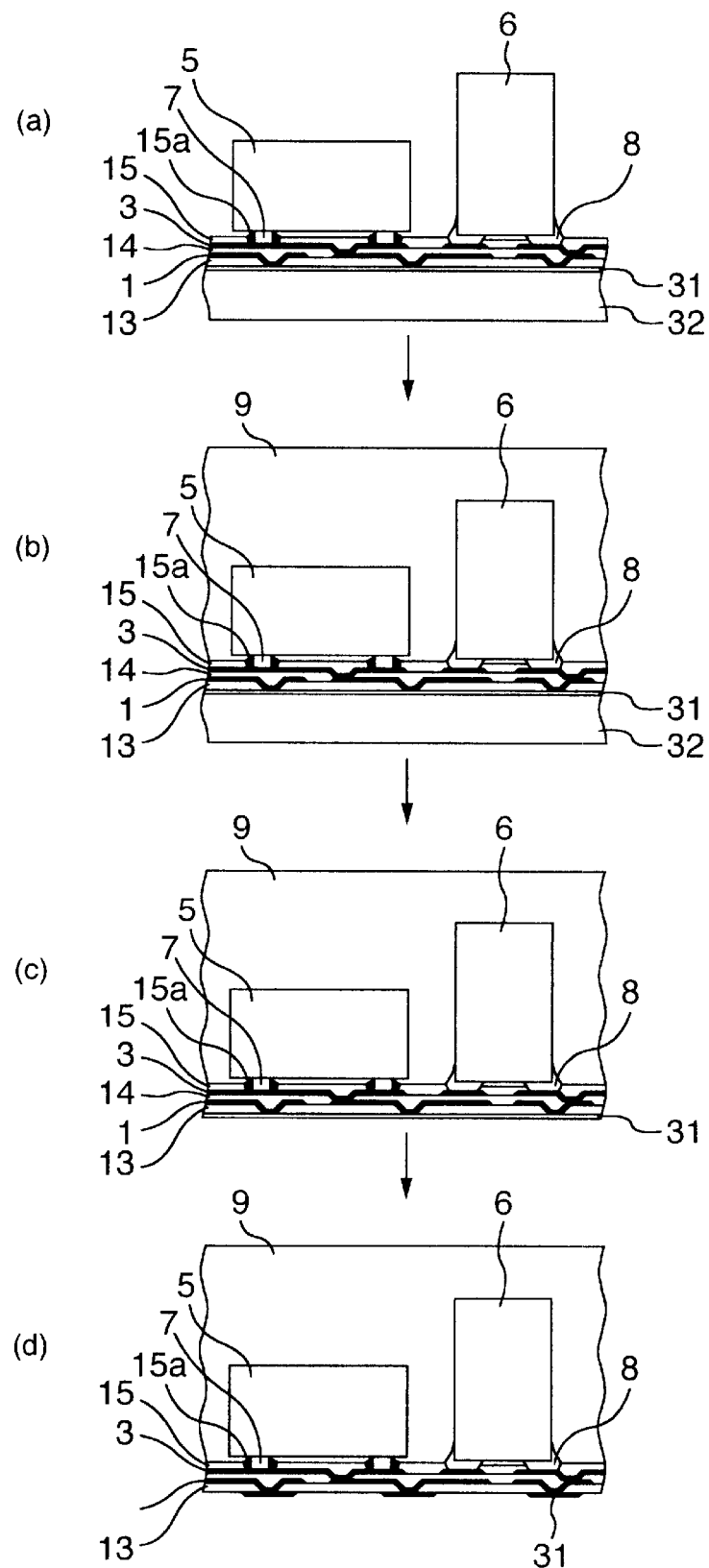
FIG. 19 includes schematic side views showing a manufacturing proceeding of a semiconductor module producing method of the invention.

A proceeding in a semiconductor module producing method is shown in FIGS. 18 and 19. At first step, as shown in part (a) of FIG. 18, the temporary substrate 32 of stainless-steel is plated with Nickel or Nickel-base-alloy to form the Nickel layer 31 of 10 $\mu$m thickness on the temporary substrate 32 of 0.3 mm thickness. Subsequently, as shown in part (b) of FIG. 18, the first electrically insulating layer 13 with the openings 13a therethrough is formed on the Nickel layer 31, by coating the surface of the Nickel layer 31 with the photosensitive electrically insulating resin, exposing the photosensitive electrically insulating resin through a mask corresponding to a desirable pattern of the first electrically insulating layer 13 with the openings 13a, and developing the photosensitive electrically insulating resin by removing a not cured part of the photosensitive electrically insulating resin to form the openings 13a surrounded by the cured part of the photosensitive electrically insulating resin as the first electrically insulating layer 13.

Subsequently, as shown in part (c) of FIG. 18, the first electrically conductive layer 1 of the desirable electrical wiring pattern is formed in the openings 13a, on the Nickel layer 31 and on the first electrically insulating layer 13, by coating by sputtering a surface region of the Nickel layer 31 exposed by the openings 13a, a surface of the first electrically insulating layer 13 and a surface of the openings 13a with Copper-Chrome-base-alloy (alternatively, Copper, Copper-base-alloy or the like), coating the Copper-Chrome-base-alloy film with the photoresist, exposing the photoresist through a mask corresponding to the first electrically conductive layer 1 of the desirable electrical wiring pattern, developing the photoresist by removing a not-cured part of the photoresist to expose a part of the Copper-Chrome-base-alloy film, plating with Copper or Copper-base-alloy the exposed part of the Copper-Chrome-base-alloy film while supplying the electric power for the plating to the Copper-Chrome-base-alloy film, and removing the cured part of the photoresist and an exposed part of the Copper-Chrome-base-alloy film under the cured part of the photoresist.

Subsequently, as shown in part (d) of FIG. 18, the second electrically insulating layer 14 with the openings 14a therethrough is formed on the first electrically conductive layer 1 and the first electrically insulating layer 13, by coating a surface of the first electrically conductive layer 1 and the first electrically insulating layer 13 with the photosensitive electrically insulating resin, exposing the photosensitive electrically insulating resin through another mask corresponding to a desirable pattern of the second electrically insulating layer 14 with the openings 14a, and developing the photosensitive electrically insulating resin by removing a part of the photosensitive electrically insulating resin not cured to form the openings 14a surrounded by the cured part of the photosensitive electrically insulating resin as the second electrically insulating layer 14. In this arrangement, if the semiconductor chip 5 and electrical circuit element 6 are mounted on the first electrically insulating layer 13 and connected electrically to the first electrically conductive layer 1 through the first electrically conductive joint 7 and second electrically conductive joint 8, and the semiconductor chip 5, electrical circuit element 6, first electrically conductive joint 7 and second electrically conductive joint 8 are covered by the monolithically extending molding resin 9, the fourth embodiment of semiconductor module is formed.

Subsequently, as shown in part (e) of FIG. 18, the second electrically conductive layer 3 of desirable electrical wiring pattern is formed on the second electrically insulating layer 14 and the electrically conductive connection 3a is formed on the first electrically conductive layer 1 through the openings 14a, by coating by sputtering a surface region of the first electrically conductive layer 1 exposed by the openings 14a, a surface of the second electrically insulating layer 14 and a surface of the openings 14a with the Copper-Chrome-base-alloy, coating the Copper-Chrome-base-alloy film with the photoresist, exposing the photoresist through a mask corresponding to the second electrically conductive layer 3 of desirable electrical wiring pattern, developing the photoresist by removing a not-cured part of the photoresist to expose a part of the Copper-Chrome-base-alloy film, plating with the Copper or Copper-base-alloy the exposed part of the Copper-Chrome-base-alloy film while supplying the electric power for the plating to the Copper-Chrome-base-alloy film, and removing the cured part of the photoresist and an exposed part of the Copper-Chrome-base-alloy film under the cured part of the photoresist.

Subsequently, as shown in part (f) of FIG. 18, the third electrically insulating layer 15 with the openings 15a therethrough is formed on the second electrically conductive layer 3, the electrically conductive connection 3a and the second electrically insulating layer 14, by coating a surface of the second electrically conductive layer 3, the electrically conductive connection 3a and the second electrically insulating layer 14 with the photosensitive electrically insulating resin, exposing the photosensitive electrically insulating resin through another mask corresponding to a desirable pattern of the third electrically insulating layer 15 with the openings 15a, and developing the photosensitive electrically insulating resin by removing a part of the photosensitive electrically insulating resin not cured to form the openings 15a surrounded by the cured part of the photosensitive electrically insulating resin as the third electrically insulating layer 15.

Subsequently, as shown in part (a) of FIG. 19, the second electrically conductive layer 3 is electrically connected to the semiconductor chip 5 by inserting the gold bumps 7 of the semiconductor chip 5 into the openings 4a, and heating the gold bumps 7 while generating a compression force between the second electrically conductive layer 3 and the semiconductor chip 5, and is electrically connected to the electrical circuit element 6 by inserting the solder 8 between the openings 4a and terminals of the electrical circuit element 6 and heating the solder 8.

Subsequently, as shown in part (b) of FIG. 19, the semiconductor chip 5, electrical circuit element 6, first electrically conductive joint 7 and second electrically conductive joint 8 are covered by the molding resin 9 to be hermetically sealed.

Subsequently, as shown in part (c) of FIG. 19, the Nickel layer 31 is removed from the temporary substrate 32 to be exposed.

Subsequently, as shown in part (d) of FIG. 19, the Nickel layer 31 is partially removed to leave the Nickel layers 10 and 10a on the first electrically conductive layer 1 and the first electrically insulating layer 13, by coating the Nickel layer 31 with the photoresist, exposing the photoresist through a mask corresponding to a desirable pattern of the Nickel layers 10 and 10a to be left, developing the photoresist by removing a not-cured part of the photoresist, removing through etching the Nickel layer 31 exposed by removing the not-cured part of the photoresist to form the left Nickel layers 10 and 10a, and removing a cured part of the photoresist on the left Nickel layers 10 and 10a. Therefore, the eleventh embodiment of semiconductor module is formed.

What is claimed is:

1. A semiconductor module comprising:
   at least one electric element including a semiconductor chip;
   an electrically conductive layer connected electrically to the electric element;
   an electrically conductive joint arranged between the electric element and the electrically conductive layer to connect electrically the electric element and the electrically conductive layer to each other;
   a molding resin covering at least partially the electric element and the electrically conductive joint; and
   an electrically insulating layer contacting at least partially the electrically conductive layer;
   wherein the electrically conductive layer includes a first layer of Nickel-base metal, and a second layer of Copper-base metal extends at least partially between the first layer and the electric element, and
   the electrically insulating layer is juxtaposed with a part of the second layer in a direction perpendicular to a thickness direction of the electrically conductive layer so that surfaces of the electrically insulating layer and the part of the second layer both prevented from facing to the electric element extend along a common flat face.

2. The semiconductor module according to claim 1, wherein the first layer extends on the surface of the electrically insulating layer along the common flat face.

3. The semiconductor module according to claim 1, wherein a boundary between the part of the second layer of said Copper-base metal and the first layer of said Nickel-base metal extends along the common flat face.

4. A semiconductor module comprising:
   at least one electric element including a semiconductor chip;
   an electrically conductive layer connected electrically to the electric element;
   an electrically conductive joint arranged between the electric element and the electrically conductive layer to connect electrically the electric element and the electrically conductive layer to each other;
   a molding resin covering at least partially the electric element and the electrically conductive joint; and
   an electrically insulating layer contacting at least partially the electrically conductive layer;
   wherein the electrically conductive layer includes a first layer of Nickel-base metal, and a second layer of Copper-base metal extends at least partially between the first layer and the electric element, and
   a surface of the first layer prevented from facing to the electric element extends between the electric element and a surface of the electrically insulating layer prevented from facing to the electric element, in a thickness direction of the electrically conductive layer.

5. A semiconductor module comprising:

at least one electric element including a semiconductor chip;

an electrically conductive layer connected electrically to the electric element;

an electrically conductive joint arranged between the electric element and the electrically conductive layer to connect electrically the electric element and the electrically conductive layer to each other;

a molding resin covering at least partially the electric element and the electrically conductive joint;

an electrically insulating layer contacting at least partially the electrically conductive layer; and a film of Nickel-base metal extending on a surface of the electrically insulating layer prevented from facing to the electric element.

6. A semiconductor module comprising:

at least one electric element including a semiconductor chip;

an electrically conductive layer connected electrically to the electric element;

an electrically conductive joint arranged between the electric element and the electrically conductive layer to connect electrically the electric element and the electrically conductive layer to each other;

a molding resin covering at least partially the electric element and the electrically conductive joint;

an electrically insulating layer contacting at least partially the electrically conductive layer; and a metallic film extending on a surface of the electrically insulating layer prevented from facing to the electric element, wherein the metallic film is electrically connected to the electrically conductive layer.

7. A semiconductor module comprising:

at least one electric element including a semiconductor chip;

an electrically conductive layer connected electrically to the electric element;

an electrically conductive joint arranged between the electric element and the electrically conductive layer to connect electrically the electric element and the electrically conductive layer to each other;

a molding resin covering at least partially the electric element and the electrically conductive joint;

an electrically insulating layer contacting at least partially the electrically conductive layer; and a metallic film extending on a surface of the electrically insulating layer prevented from facing to the electric element, wherein the metallic film is magnetically permeable.

* * * * *